US005396143A

United States Patent [19]

Seyed-Bolorforosh et al.

[11] Patent Number: 5,396,143

[45] Date of Patent: Mar. 7, 1995

[54] ELEVATION APERTURE CONTROL OF AN ULTRASONIC TRANSDUCER

[75] Inventors: Mir S. Seyed-Bolorforosh, Palo Alto; Michael Greenstein, Los Altos; Hewlett E. Melton, Jr., Sunnyvale, all of Calif.

[73] Assignee: Hewlett-Packard Company, Palo Alto, Calif.

[21] Appl. No.: 246,593

[22] Filed: May 20, 1994

[51] Int. Cl.[6] .......... H01L 41/08

[52] U.S. Cl. .......... 310/334; 310/320; 128/662.03

[58] Field of Search .......... 128/660.01, 660.07, 128/661.01, 662.03; 310/334, 357, 320, 322, 325; 73/625, 626, 628

[56] References Cited

U.S. PATENT DOCUMENTS

| | | | |
|---|---|---|---|
| 4,518,889 | 5/1985 | 'T Hoen | 310/357 |
| 4,825,115 | 4/1989 | Kawabe et al. | 310/327 |
| 5,060,651 | 10/1991 | Kondo et al. | 128/660.07 |
| 5,065,068 | 11/1991 | Oakley | 310/357 |
| 5,097,709 | 3/1992 | Masuzawa | 128/661.01 |

OTHER PUBLICATIONS

Huang, Dehua et al., "An Ultrasonic Gaussian Transducer with a Spherical Button Electrode," 1991 *Ultrasonics Symposium*, 1051-0117/91/0000-0473, 1991, pp. 473-476.

Pan, W. Y. et al., "Large Piezoelectric Effect Induced by Direct Current Bias in PMN:PT Relaxor Ferroelectric Ceramics," *Japanese Journal of Applied Physics*, vol. 28, No. 4, Apr., 1989, pp. 653-661.

Preston, R. C. et al., "PVDF membrane hydrophone performance properties and their relevance to the measurement of the acoustic output of medical ultrasonic equipment," *J. Phys. E: Sci. Instrum.*, vol. 16, 1983, pp. 786-796.

Smith, Wallace Arden, "New opportunities in ultrasonic transducers emerging from innovations in piezoelectric materials," *SPIE*, vol. 1733, 1992, pp. 3-26.

*Primary Examiner*—George Manuel

[57] ABSTRACT

An ultrasonic transducer for controlling an elevation aperture utilizes the electric field-induced polarization properties of relaxor ferroelectric materials. The Curie temperature of the material is typically close to room temperature, so that the application of a bias voltage provides piezoelectric activity. By varying the thickness of a dielectric layer that spaces apart the relaxor ferroelectric material from an electrode or providing the bias voltage, the piezoelectric activity can be tailored. That is, degrees of polarization of the relaxor ferroelectric material are varied spatially in correspondence with changes in thickness of the dielectric layer. The effective elevation aperture of the transducer can be varied by adjusting the bias voltage.

20 Claims, 6 Drawing Sheets

ELEVATION APERTURE CONTROL OF AN ULTRASONIC TRANSDUCER

TECHNICAL FIELD

The present invention relates generally to acoustic transducers and more particularly to providing a transducer and a method for operating the transducer for varying transducer elevation aperture size to provide fine control of the emitted beam profile at various imaging depths.

BACKGROUND ART

A diagnostic ultrasonic imaging system for medical use forms images of tissues of a human body by electrically exciting an acoustic transducer element or an array of elements to generate a controlled beam of acoustic waves with short duration emitted acoustic pulses that are caused to travel into the body. Echoes from the tissues are received by the acoustic transducer element or elements and are converted into electrical signals. The electrical signals are amplified and used to form a cross sectional image of the tissues. Echographic examination by transmitting and receiving acoustic wave energy is also used outside of the medical field for interrogation into other mediums of interest.

A conventional ultrasonic transducer is formed of a piezoelectric material, such as lead zirconium titanate (PZT), that has undergone a poling process to become macroscopically piezoelectric. The poling process is one in which the piezoelectric material is raised to an elevated temperature and subjected to a strong electric field to align dipoles of the material. The temperature must be greater than the Curie temperature of the material that marks the transition between ferromagnetism and paramagnetism. The Curie temperature is typically greater than 100° Celsius.

The electrical field provided during the poling process aligns the microscopic polar regions of the piezoelectric material, i.e. the dipoles are aligned. Allowing the temperature to fall below the Curie temperature while maintaining the poling field fixes the dipoles in alignment. In this manner, the piezoelectric material remains macroscopically polarized, even after the poling field is removed.

Kawabe describes an ultrasonic transducer in U.S. Pat. No. 4,825,115. The transducer has an azimuthal direction and an elevation direction. As noted in the patent, the beam of ultrasonic pulses from a particular piezoelectric element has a fixed expanse in the elevation direction, with the fixed expanse being determined by the length of the piezoelectric element and the wavelength of the output ultrasonic pulses. The patent further notes that in order to vary the focal length of the ultrasonic transducer, the piezoelectric element may be divided into a matrix of smaller piezoelectric elements. However, in the same manner as the single-element transducer, the resulting matrix has a generally fixed focal length in the elevation direction. Furthermore, the increased number of elements requires a larger number of interconnections with more complex electronics. The scanning beam is typically controlled along the azimuth direction electronically, with the beam characteristics being fixed along the elevation axis.

U.S. Pat. No. 4,518,889 to 'T Hoen describes an ultrasonic transducer that is apodized to reduce side lobe levels by causing the level of response to vary as a function of the position on the transducer aperture. For example, the polarization of a piezoelectric body maybe controlled by locally polarizing regions of the transducer with different voltages or for different periods of time. A tailored polarization profile can be achieved by means of the apodized transducer, but again the result is a fixed focal length.

Ultrasonic imaging of a number of bodies having different depths may be performed by employing separate devices, with each device being tailored to a different, but fixed, elevation focal length. However, such an approach is not likely to be cost efficient. Moreover, the body of interest may be so large as to prevent high resolution imaging by a transducer having a fixed focal length along an elevation plane, so as to require a variable elevation aperture size.

Another concern in the design and operation of an ultrasonic device is suppressing lateral modes of vibration. Undesired lateral modes may arise from a number of sources. For example, fringe electrical fields may generate lateral modes during the transmission of acoustic waves. Additionally, bodies that are adjacent to a body of interest will reflect acoustic waves, even though the waves are focused at the body of interest. The lateral modes will adversely affect the ultrasonic imaging process.

What is needed is a device and method for transmitting and receiving acoustic waves such that the focal length of the device can be varied as desired by varying the effective aperture size along the elevation plane, as well as the azimuth plane. What is also needed is such a device and method that suppresses lateral modes of vibration.

SUMMARY OF THE INVENTION

The invention controls an effective size of the elevation aperture of an acoustic transducer by utilizing electric field-induced polarization properties of a relaxor ferroelectric material, together with its low Curie temperature. A "relaxor ferroelectric material" is defined herein as being within that class of materials having a Curie temperature that is below 60° C. Typically, a relaxor ferroelectric material has a Curie temperature close to room temperature. Thus, the material can be poled by applying a polarization voltage when the transducer is at room temperature. Terminating the application of the polarization voltage returns the material to a random polarization state. An acceptable relaxor ferroelectric material is lead magnesium niobate-lead titanate (PMN:PT).

In a preferred embodiment, the acoustic transducer is an ultrasonic device having a planar surface on which a thin dielectric layer, which is substantially acoustically transparent at the operating frequency, is formed to have a varying thickness. An electrode is formed atop the dielectric layer. A bias voltage is applied across the relaxor ferroelectric material. Because the dielectric layer has a varying thickness, the potential drop across the dielectric layer varies. That is, there are localized spatial differences in the established static polarization voltage across the relaxor ferroelectric transducer.

The localized potential drop across the dielectric layer varies in accordance with localized capacitances by the following equations:

$$V_2 = V \times \left( \frac{C_1}{C_1 + C_2} \right),$$

-continued $$V_1 = V \times \left( \frac{C_2}{C_1 + C_2} \right),$$

where $V_1$ and $V_2$ are the localized voltage drops across the dielectric layer and the relaxor ferroelectric material, respectively, where V is the sum of $V_1$ and $V_2$, and where $C_1$ and $C_2$ are the localized capacitances across the dielectric layer and the relaxor ferroelectric material. Since $C_1$ varies spatially, there is a corresponding spatial variation in $V_1$ and $V_2$ for a constant V, which is generally equal to the applied static polarization voltage across the transducer.

In the preferred embodiment, the dielectric layer increases in thickness with approach to edges of the transducer. At the central region of the transducer, the electrode formed atop the dielectric layer may make contact with the relaxor ferroelectric material. A second electrode is formed on the side of the transducer opposite to the dielectric layer. Optionally, the second electrode may be formed on a dielectric layer that also varies in thickness.

Increasing the bias voltage from 0 volts causes the central region of the transducer to become piezoelectrically active before the activation of those regions along the edges of the transducer. The bias voltage forms a static polarization electric field that polarizes the relaxor ferroelectric material. The degree of local polarization is dependent upon the local applied voltage, until the saturation level is reached. At the saturation level, an increase in the bias voltage provides no further increase in localized sensitivity, or electromechanical coupling. Until the saturation level is reached, increases in the bias voltage increase the elevation aperture size and, consequently, the diameter of the interrogation beam of acoustic waves at various depths. The invention only works with transducers made from relaxor ferroelectric materials, since such materials exhibit the necessary saturization properties and achieve an electric field induced, substantially room-temperature polarization. The variation in the elevation aperture size provides a means for providing greater control of beam diameter at various imaging depths.

Optionally, a third electrode can be formed between the tapering dielectric layer and the relaxor ferroelectric layer. The excitation RF signal is channeled to this third electrode in order to ensure a small RF voltage drop across the dielectric layer. Alternatively, the input impedance of receiver electronics may be reduced, so as to reduce the amount of current passing through the dielectric layer. A third approach to minimizing the RF excitation signal drop across the dielectric layer is to take into account the RF potential drop across the tapered dielectric layer in determining the bias voltage for a desired effective aperture size and, consequently, penetration depth. Thus, the localized sensitivity would be determined by a combination of the RF potential drop and the static DC potential drop. A thinner dielectric layer would be required, so that the dielectric layer would be virtually acoustically transparent at the operating frequency of the transducer. A fourth approach is one in which the third electrode is sandwiched between two layers of relaxor ferroelectric material, with the outer surface of each layer having a dielectric layer that changes in thickness.

To ensure that lateral modes of resonance are not excited by the application of an electric field at an oblique angle to the relaxor ferroelectric layer, a thin sparse metallic layer may be formed under the tapered dielectric layer. In this manner, the lines of the electric field would enter the relaxor ferroelectric layer at a normal angle.

An advantage of this invention is that the beam diameter at various depths can be adjusted along the elevation plane as well as the azimuth plane during operation of the ultrasonic device. Thus, a spatial sampling beam with greater control of the beam diameter is provided, and consequently an improved gray scale image of a body of interest can be formed by continuously adjusting the elevation aperture of the transducer. An improved near-field image is obtainable with the same transducer that provides adequate sensitivity for detection of weak echoes at significant depth into a medium of interest.

BEST MODE FOR CARRYING OUT THE INVENTION

Figure 1:
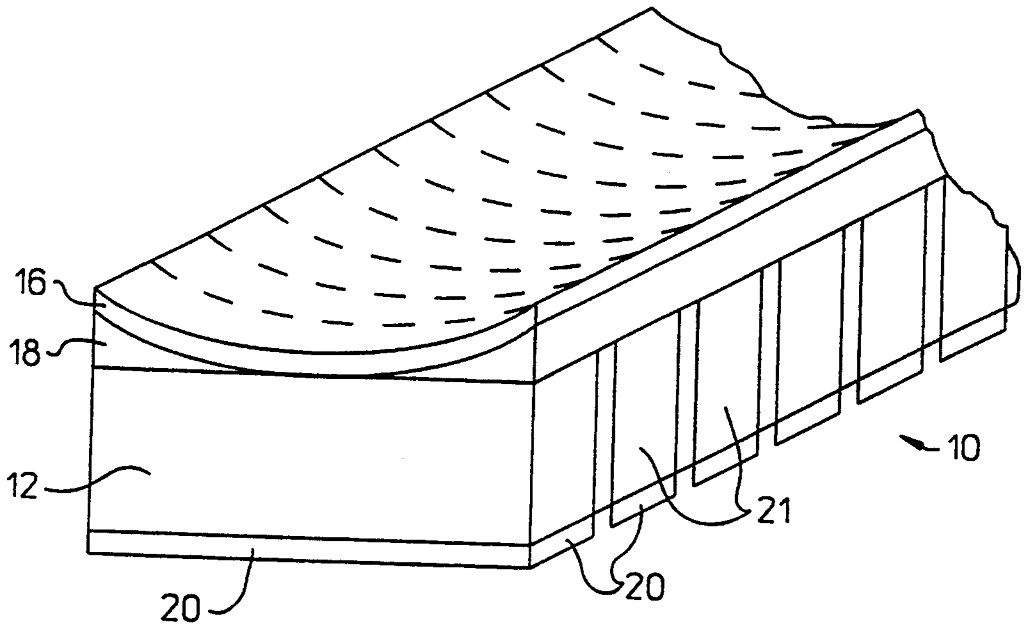
FIG. 1 is a perspective view of an ultrasonic transducer for controlling an elevation aperture in accordance with the invention.
Figure 2:
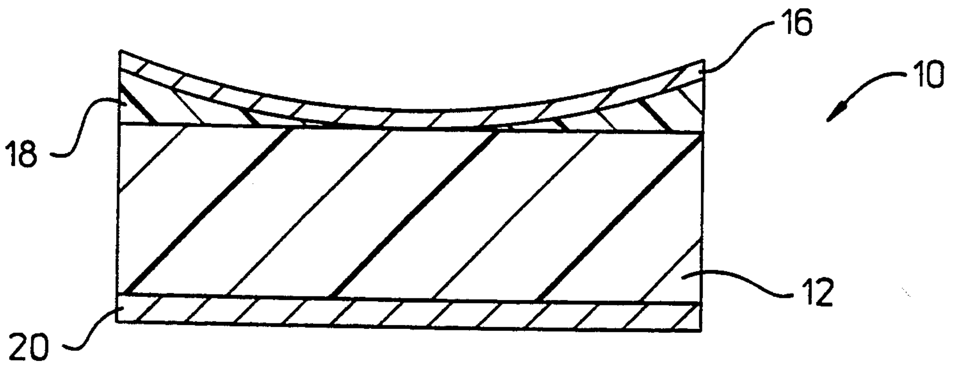
FIG. 2 is a side sectional view along the elevation direction of the transducer at FIG. 1.

With reference to FIGS. 1 and 2, an ultrasonic transducer 10 includes a relaxor ferroelectric layer 12. Such layers are sometimes referred to as electrostrictive layers. Relaxor ferroelectric materials are characterized by their electric field-induced polarization properties. Typically, the Curie temperature is at or below room temperature. In all applications, the Curie temperature of the layer 12 is less than 60° C. An acceptable material for forming the layer 12 is modified lead magnesium niobate-lead titanate (PMN:PT), which is described by Pan et al. in an article entitled "Large Piezoelectric Effect Induced by Direct Current Bias in PMN:PT Relaxor Ferroelectric Ceramics," *Japanese Journal of Applied Physics,* Vol. 28, No. 4, April 1989, pages 653–661.

Figure 5:
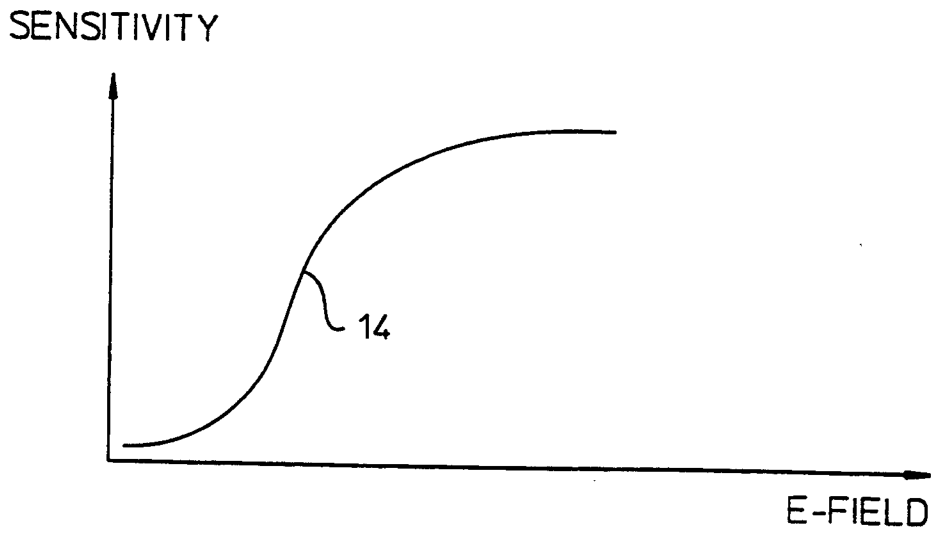
FIG. 5 (PRIOR ART)
FIG. 5 is a graph of changes in sensitivity as a function of changes in bias voltage for a relaxor ferroelectric layer.

Because the relaxor ferroelectric layer 12 exhibits a Curie temperature close to room temperature, the layer can be poled by maintaining the temperature of the transducer 10 at or above room temperature and applying a bias voltage. Referring briefly to FIG. 5, the intensity of an electric field across a relaxor ferroelectric layer affects the sensitivity, i.e. the electromechanical coupling coefficient. The plot 14 shows an increase in sensitivity with an increase in bias voltage across the layer. However, the saturation level is soon reached, so that further increases in the bias voltage do not translate to increases in sensitivity. As an example, the saturation level may be reached at 3-5 KV/cm.

Returning to FIG. 2, a first electrode 16 is shown atop the ultrasonic transducer 10. The first electrode is spaced apart from the relaxor ferroelectric layer 12 by a dielectric layer 18 that varies in thickness across the upper surface of the layer 12. At the lower surface of the relaxor ferroelectric layer 12 is a second electrode 20. The second electrode is shown as being parallel to the lower surface, rather than having a concave configuration similar to the first electrode 16. However, the second electrode may be spaced apart from the relaxor ferroelectric layer by a second dielectric layer that varies in thickness.

In FIG. 1, the transducer 10 is shown as being an array of transducer elements 21, with each element being associated with a separate bottom electrode 20. The fabrication of arrays of transducer elements is known in the art. The employment of an array of elements is not critical to the invention.

The principle of operation of the ultrasonic transducer 10 is based upon spatial control of the static polarization electric field across the relaxor ferroelectric layer 12. The spatial control is achieved by the tapered dielectric layer 18. A quasi static voltage is applied across the first and second electrodes 16 and 20 to establish the static electric field. While each electrode is a region of equipotential, the changes in thickness of the dielectric layer provide different potential drops across the dielectric layer. The localized potential drop across the dielectric layer 18 varies as a function of the localized capacitance of the dielectric layer. This localized potential drop may be determined as follows:

$$V_2 = V \times \left(\frac{C_1}{C_1 + C_2}\right),$$

$$V_1 = V \times \left(\frac{C_2}{C_1 + C_2}\right),$$

where $V_1$ and $V_2$ are the localized voltage drops across the dielectric layer 18 and the relaxor ferroelectric layer 12, respectively, where V is the potential difference between first and second electrodes 16 and 18, and where the capacitances $C_1$ and $C_2$ are the localized capacitances across the dielectric layer and the relaxor ferroelectric layer, respectively. As is shown schematically in FIG. 3, a bias voltage is applied at inputs 22 and 24 to the first and second electrodes 16 and 20. A lower set of capacitances 26 represents the localized capacitances across the relaxor ferroelectric layer 12. Because this layer has a uniform thickness, the capacitances are uniform. On the other hand, an upper set of capacitances 28, 30, 32, 34, 36 and 38 vary in correspondence with the thickness of the dielectric layer 18. The capacitance is at a maximum at the central region of the transducer 10. This is represented by capacitance 28. The localized capacitance of the dielectric decreases with approach to the edges of the transducer, since the dielectric layer is thickest at the edges. Thus, capacitances 38 represent the greatest voltage drop across the dielectric layer. That is, $V_1$ is at a minimum at the central region of the ultrasonic transducer and $V_1$ is at the maximum at the edges.

Figure 3:
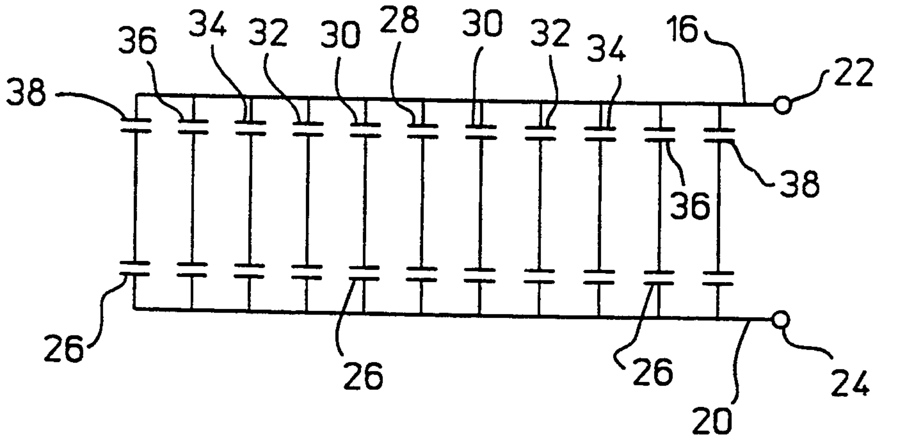
FIG. 3 is a schematic representation of the localized capacitances of the transducer of FIG. 1.

Referring to FIGS. 1-3, the radiating surface of each element 21 of the ultrasonic transducer 10 may be considered as comprising a matrix of sections that are distinguished by the localized capacitances. As a static polarization electric field is created by increasing the potential difference at inputs 22 and 24 from 0 volts, the central sections of the elevation aperture of the transducer become active before activation of the sections closer to the edges of the elevation aperture. In this manner, the elevation aperture is dynamically controlled by controlling the strength of the electric field.

The dielectric layer 18 is preferably formed of a polymer-based material. For an ultrasonic transducer 10 having a resonant operating frequency of 3 MHz, with 30 dB of switching between the central sections and the edge sections along the elevation aperture, an acceptable material for forming the dielectric layer is unpoled polyvinylidene difluoride (PVDF). The relative dielectric constant of PVDF is approximately 10. The thickness of the dielectric layer toward the edges of the ultrasonic transducer is approximately 12 $\mu$m, where the thickness of the PVDF dielectric layer is 0 at the center of the elevation aperture, i.e. if the first electrode 16 contacts the relaxor ferroelectric layer 12 at the center. For optimal operation, the maximum thickness of the dielectric layer should not exceed one-tenth the wavelength of the resonant operating frequency of the transducer, making the dielectric acoustically transparent.

As previously noted with respect to FIG. 5, the sensitivity of a relaxor ferroelectric layer 12 increases with the increased electric field created across the layer. Because the voltage $V_2$ applied to localized sections of the relaxor ferroelectric layer 12 of FIG. 1 varies according to the equation set forth above, the electric field-induced polarization properties of the relaxor ferroelectric material are used to control the elevation aperture in a manner shown in FIG. 4. A first plot 40 shows a sensitivity that does not reach saturation even at the central region of the ultrasonic transducer 10. The sensitivity quickly falls off because the thicker regions of the dielectric layer 18 prevent regions away from the central region from becoming piezoelectrically active. That is, at the bias voltage that provides the plot 40, the voltage drop across the dielectric layer 18 allows only a small degree of dipole alignment within the underlying relaxor ferroelectric layer 12.

Figure 4:
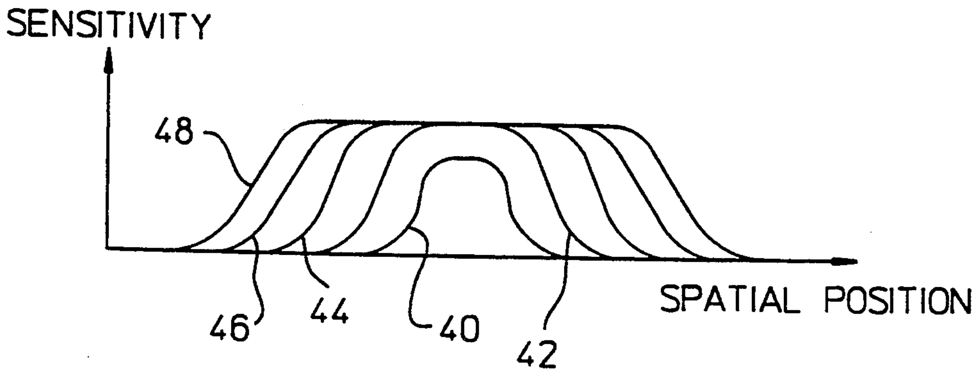
FIG. 4 is a graph of the effective elevation aperture of FIG. 1 as a function of intensity of a bias voltage.

As the bias voltage applied across the first and second electrodes 16 and 20 at the inputs 22 and 24 is increased, a second plot 42 of FIG. 4 shows that the piezoelectric activity at the central region of the ultrasonic transducer 10 reaches saturation and that the effective elevation aperture has increases in size. Successive increases in the bias voltage generate plots 44, 46 and 48. In the final plot 48, some sensitivity is achieved even at the edges of the ultrasonic transducer 10. Moreover, a greater percentage of the transducer has reached the saturation level.

Figure 7:
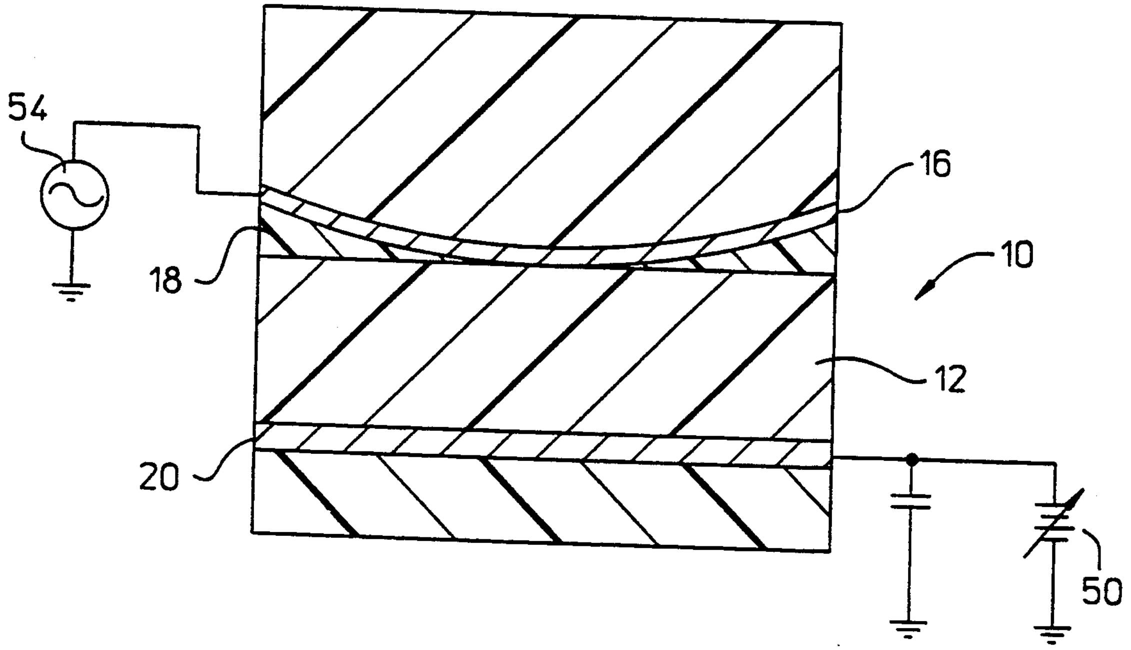
FIG. 7 is a side sectional view of the transducer of FIG. 1 connected to a source of bias voltage and a source of an excitation signal.
Figure 6:
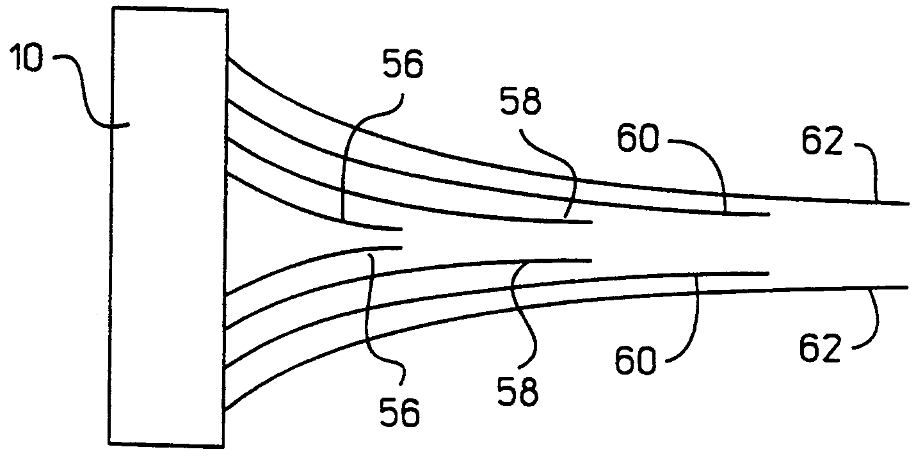
FIG. 6 is a schematical representation of the emitted beam along the elevation of the transducer of FIG. 1.

The operation of the ultrasonic transducer 10 will be described with reference to FIGS. 6 and 7. A variable source 50 of DC voltage is connected to the second electrode 20. The first electrode 16 is connected to a source 54 of a RF excitation signal, together with receiver electronics. Alternatively, both the DC source 50 and the excitation signal source 54 may be connected to the same electrode, with the other electrode being tied to ground potential. However, the separate application of the DC current and the excitation signal provides some advantages. For example, if the structure of FIG. 7 is a single transducer element in an array of transducer elements, the number of electrical connections to the array can be reduced.

The ultrasonic transducer 10 may have a resonant operating frequency of 3 MHz. At a relatively low bias voltage applied to the second electrode 20, only the central region of the transducer becomes piezoelectrically active. As a result, an interrogation beam, represented by lines 56, has a limited penetration into a medium of interest, with a small beam diameter at shallow depths. At this low voltage, bodies within a range of 0 cm to 1 cm are well defined by operation of the transducer 10. Thus, the near-field image capabilities of the transducer are maximized. Moreover, the spatial drop in sensitivity caused by the spatial taper of the dielectric layer also helps reduce side lobes.

An increase in the bias voltage to the second electrode 20 increases the effective elevation aperture of the transducer 10 to provide a beam represented by lines 58. The depth of penetration into a medium of interest is increased. Regions of interest at a depth in the range of 1 cm to 2 cm may be imaged. Additional increases in depth by increments of 1 cm are provided by further increases to the bias voltage, as represented by lines 60 and lines 62. By way of example, the penetration depth of the beam represented by lines 62 may be achieved by a bias voltage of approximately 20 KV/cm.

In operation, the quasi-static potential may be fixed during an echocardiographic imaging process. However, in a preferred embodiment, the operation is one in which the bias voltage is varied over a single imaging procedure or frame. For example, the four beams represented in FIG. 5 may be generated during an echocardiographic interrogation of human tissue, with the results being combined to form a single image. In this manner, an improved gray scale image can be provided, as compared to an image formed by an ultrasonic transducer having a fixed beam diameter.

The ultrasonic transducer 10 may be operated at room temperature while adjustments are made to the alignment of dipoles of the relaxor ferroelectric material. A high resolution image at all depths can be formed using the same transducer, while having a sufficient sensitivity to weak echoes from deeper depths. Moreover, the diameter of the beam remains relatively constant at all scanning depths.

FIG. 7 includes a front matching layer 53 and a backing layer 55. Such layers are well known in the art. The front matching layer is selected of a material having an acoustic impedance between that of the relaxor ferroelectric transducer 12 and that of the medium of interest, e.g. water. The purpose of the layer 53 is to reduce the impedance mismatch between the transducer and the medium of interest, thereby increasing the efficiency of transmission. The backing layer 55 is made of a material which absorbs rearwardly directed ultrasonic wave energy.

One concern in the operation of the ultrasonic transducer 10 of FIG. 7 is the voltage drop of the RF excitation signal across the dielectric layer 18. This concern may be addressed by increasing the input impedance of receiver electronics for echocardiographic process imaging. The increase in the input impedance of the receiver electronics reduces the amount of current passing through the dielectric layer 18. A somewhat simpler approach is to account for the RF potential drop across the tapered dielectric layer 18. The localized sensitivity would then be a combination of the potential drop of the RF signal from source 54 and the potential drop of the static DC from source 50. In this manner, the dielectric layer 18 should be uniformly thinner.

Figure 8:
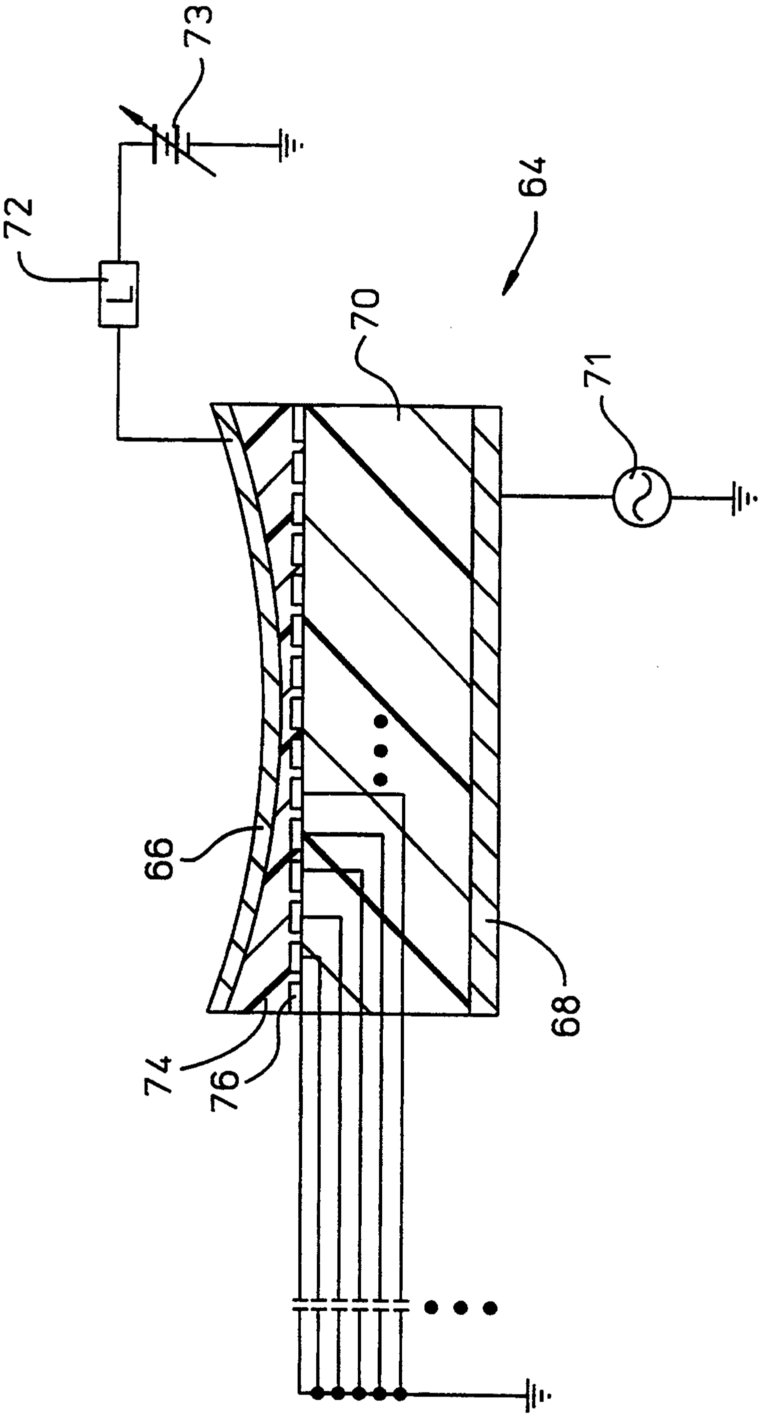
FIG. 8 is a side sectional view of an ultrasonic transducer, with the transducer having a third electrode.
Figure 9:
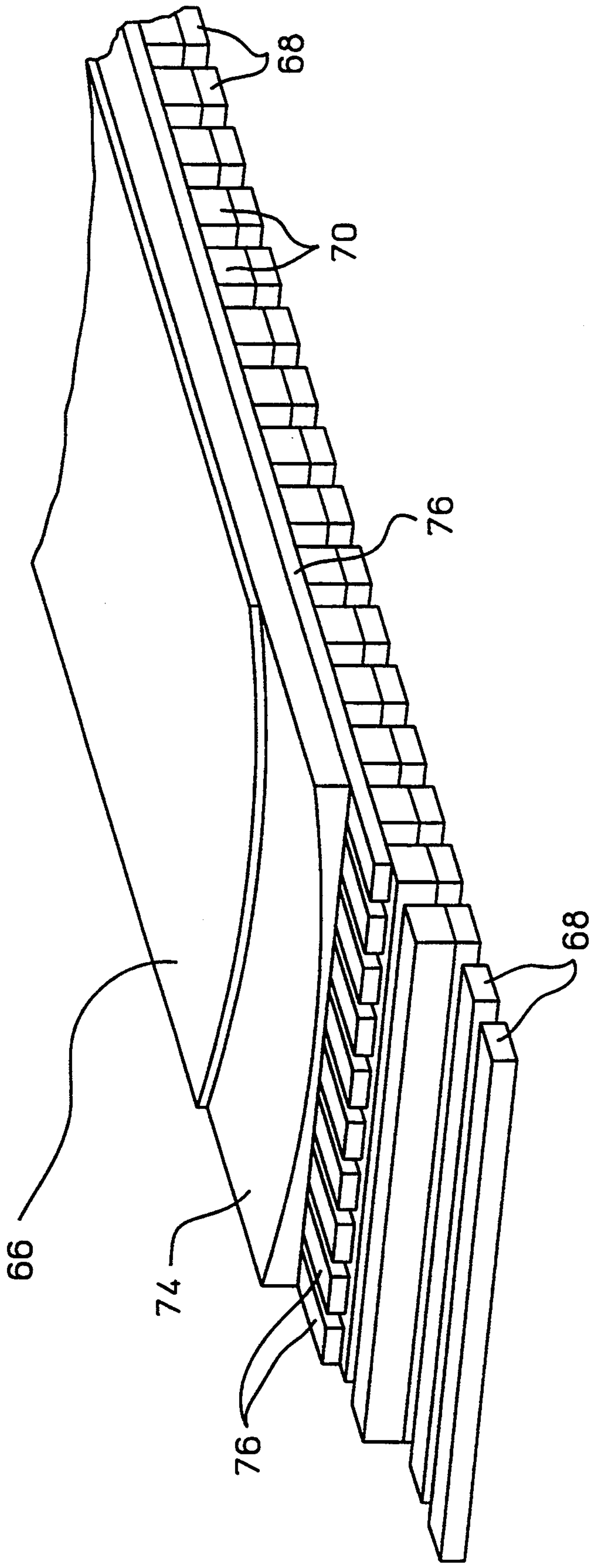
FIG. 9 is a perspective, partially cutaway view of the transducer of FIG. 8.

Yet another approach to minimizing RF voltage drop across the dielectric layer 18 is to provide the multiwire connection of an ultrasonic transducer 64 as shown in FIGS. 8 and 9. The transducer 64 includes a first electrode 66, parallel second electrodes 68, and a relaxor ferroelectric layer 70 similar to those described above. The second electrodes are connected to a source/receiver of an RF signal 71, while the first electrode is connected to a variable DC voltage source 73 via an inductive load 72. The load 72 acts as blocking component to passage of RF current from the source/receiver 71. A dielectric layer 74 varies in thickness to allow spatial control of the alignment of dipoles of the relaxor ferroelectric layer 70. Unlike the embodiment described above, the dielectric layer extends across the entirety of the upper surface of the relaxor ferroelectric layer 70. Parallel third electrodes 76 are connected to ground potential via capacitive loads 78 that block passage of DC current from the DC source 73. Each third electrode is connected to a separate capacitive load, but only some of the loads are shown in FIG. 8. Consequently, the excitation signal is connected directly across the relaxor ferroelectric layer 70, rather than being connected in a manner that requires passage through the dielectric layer, while the bias voltage is applied in a manner that achieves the desired variation of polarization.

Figure 10:
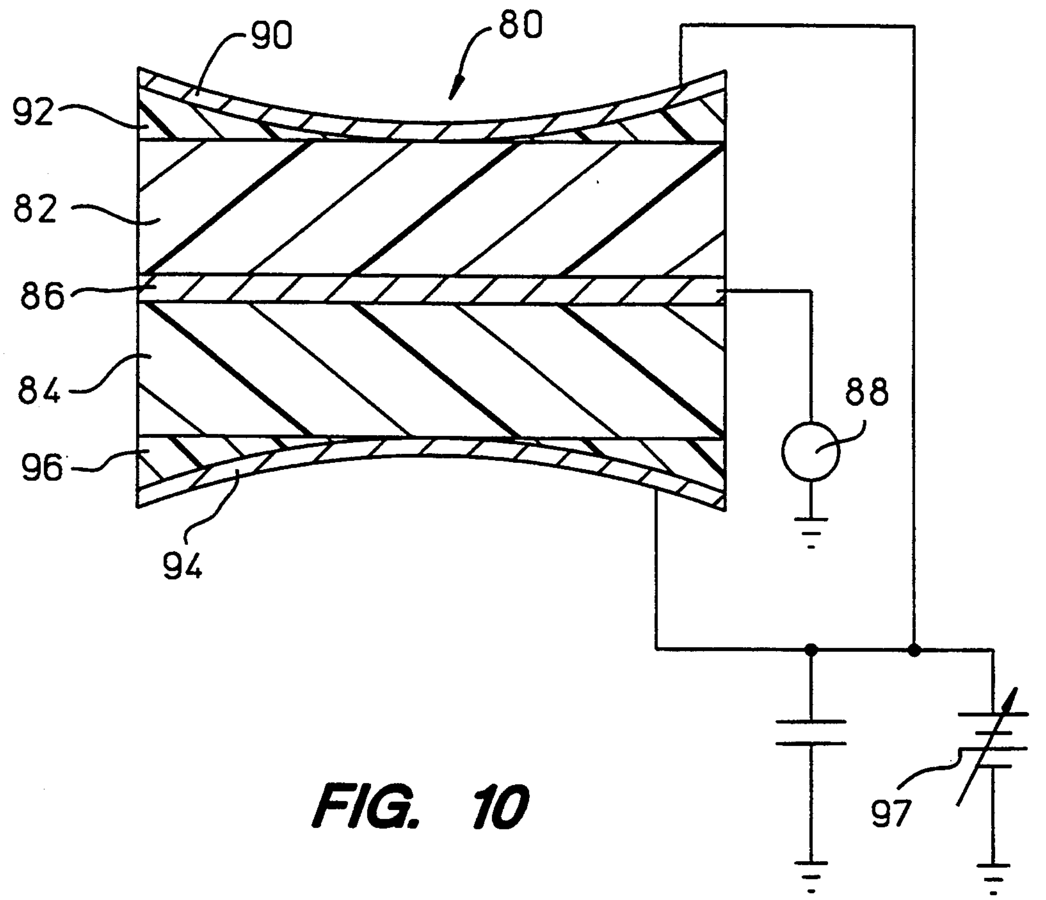
FIG. 10 is a side sectional view of a third embodiment of an ultrasonic transducer for controlling elevation aperture.

Yet another manner of addressing the RF drop across the dielectric layer is shown in FIG. 10. An ultrasonic transducer 80 includes an upper relaxor ferroelectric layer 82 and a lower relaxor ferroelectric layer 84. Between the two electrostrictive layers 82 and 84 is an electrode layer 86. This electrode layer is in electrical communication with a source 88 of a RF excitation signal. A first electrode 90 is spaced apart from the upper relaxor ferroelectric layer 82 by a tapered dielectric layer 92. In like manner, a second electrode 94 is spaced apart from the lower relaxor ferroelectric layer 84 by a tapered dielectric layer 96.

The multi-layer electrostrictive ceramic embodiment of FIG. 10 requires uniformly thinner dielectric layers 92 and 96, since a bias voltage from a variable DC source 97 can be connected to both the outer electrodes 90 and 94. Typically, the outer electrodes are electrically connected to a single DC source, as shown in FIG. 9. Because the dielectric layers are thinner, the RF potential drop across a particular dielectric layer is less than that of the embodiments described above.

Another important concern in the formation of the invention is providing a reproducible method of forming the tapered dielectric layer. The "tapered" dielectric layer is shown as a lamination of the ultrasonic transducer 98 of FIG. 11. The lamination includes four films 100, 102, 104 and 106. Acceptable dielectric materials for forming the films 100–106 include PVDF, silicon dioxide, silicon nitride, polyamide, and photoresist. Each film may have a thickness of up to 1 $\mu$m if polyamide is the dielectric of choice, while a typical film thickness for photoresist would be approximately 0.5 μm.

Conventional masking and photolithographic techniques are employed to pattern the four films 100–106 that form the tapering dielectric layer. An electrode 108 is then formed of a material having a good step coverage, so as to ensure continuity of the electrode across the relaxor ferroelectric layer 110.

A second approach to the patterning of a dielectric layer is to first deposit one or more layers and then remove a greater portion of the material from a central region of the transducer than from the edge regions. Potential removal methods include wet chemical etching, dry plasma etching and ultraviolet laser ablation. An advantage of the laser ablation method is that by using a computerized motion control, removal can be performed without masking. For a given laser intensity, a fixed amount of material, e.g., approximately 0.5 μm, is removed upon each laser pulse. The number of pulses applied to each location determines the total thickness of material that is removed. Whether the laser ablation method or a mask-and-etch method is selected, the thickness of the steps created by the processing may be less than 0.5 μm.

Figure 11:
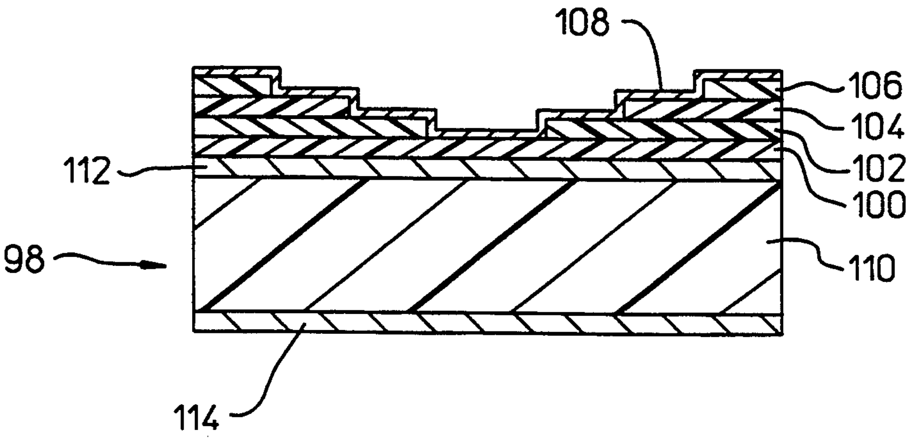
FIG. 11 is a side sectional view of a fourth embodiment of an ultrasonic transducer for controlling elevation aperture.

Whether the additive process as described with reference to FIG. 11 or the subtractive processing of laser ablation or etching is selected in patterning the dielectric layer, an optional step is to provide a final etch for rounding off the corners of the steps. The final etch smoothes the taper and reduces the possibility that the subsequently deposited electrode 108 will include a discontinuity.

Another concern in the formation of an ultrasonic transducer having the tapering dielectric layer is ensuring that the lines of electric field generated by the electrical potential across the electrode on the dielectric layer enter the relaxor ferroelectric layer at a normal angle. At this angle, lateral modes of resonance are less likely to be excited than if the electric field enters at an oblique angle to the relaxor ferroelectric layer. In FIG. 11, a sparse metallic layer 112 has been formed between the relaxor ferroelectric layer 110 and the films 100–106 that define the dielectric layer. The metallic layer acts to align the lines of the electric field generated by the top electrode 108. The spacing and the width of the sparse metallic layer must be selected to satisfy the spatial sampling requirements of the ultrasonic transducer 98. A bottom electrode 114 is shown as being planar, but this electrode may also be formed on the tapering dielectric layer. Again, a sparse metallic layer can be used to align the electric field.

We claim:

1. A device for transmitting and receiving acoustic waves comprising:

a relaxor ferroelectric transducer for converting between electric wave energy and acoustic wave energy, said relaxor ferroelectric transducer having opposed generally planar sides;

first electrode means for applying an electrical signal across said relaxor ferroelectric transducer, said first electrode means being in electrical communication with said relaxor ferroelectric transducer along a first of said opposed planar sides; and dielectric means extending between said relaxor ferroelectric transducer and said first electrode means for locally varying alignment of dipoles of said relaxor ferroelectric transducer, said dielectric means having a varying thickness, wherein said electrical communication of said first electrode means with said relaxor ferroelectric transducer changes in correspondence with said thickness.

2. The device of claim 1 further comprising a second electrode means on a second of said opposed planar sides, one of said first and second electrode means being connected to a source of DC voltage.

3. The device of claim 2 further comprising a source of an excitation signal connected to one of said first and second electrode means.

4. The device of claim 1 wherein said relaxor ferroelectric transducer has a Curie temperature below 60° C.

5. The device of claim 1 wherein said dielectric means is a polymer-based material.

6. The device of claim 1 wherein said dielectric means has a maximum thickness at or within one-tenth of the wavelength of a resonance operating frequency of said relaxor ferroelectric transducer.

7. The device of claim 1 wherein said relaxor ferroelectric transducer has edges and wherein said dielectric means is a dielectric layer, said thickness of said dielectric layer increasing with approach to said edges.

8. The device of claim 1 wherein said first electrode means is in contact with said relaxor ferroelectric transducer at a central region of said relaxor ferroelectric transducer and is spaced apart from said relaxor ferroelectric transducer by said dielectric means at regions spaced apart from said central region.

9. The device of claim 1 wherein said relaxor ferroelectric transducer includes a plurality of electrostrictive ceramic layers spaced apart by electrode layers, said opposed generally planar sides of said relaxor ferroelectric transducer each having a dielectric means for locally varying said alignment of dipoles of said electrostrictive ceramic layers.

10. The device of claim 1 further comprising a second electrode means disposed between said dielectric means and said relaxor ferroelectric transducer for applying an excitation signal to said relaxor ferroelectric transducer.

11. A device for transmitting and receiving acoustic waves comprising:

a transducer having a relaxor ferroelectric ceramic layer, said transducer having a first major side and an opposed second major side;

a dielectric layer on said first major side, said dielectric layer increasing in thickness with departure from a central region of said first major side;

a first electrode layer formed on said first major side at a side of said dielectric opposite to said transducer;

a second electrode layer formed on said second major side;

a first source of an excitation signal connected to one of said first and second electrode layers; and a second source of a biasing voltage connected to one of said first and second electrode layers, wherein degrees of polarization of said relaxor ferroelectric ceramic layer are varied spatially in correspondence to said changes in thickness of said dielectric layer and wherein said transducer has an effective elevation aperture that varies in response to changes in said biasing voltage from said second source.

12. The device of claim 11 wherein said relaxor ferroelectric ceramic layer is a PMN:PT.

13. The device of claim 11 wherein said dielectric layer is polymer based.

14. The device of claim 11 wherein said transducer has a resonant operating frequency and wherein said thickness of said dielectric layer has a maximum at or below one-tenth the wavelength of said resonant operating frequency.

15. The device of claim 11 wherein said source of biasing voltage is an adjustable DC supply.

16. The device of claim 11 wherein said transducer includes a second relaxor ferroelectric ceramic layer having said second electrode layer on a first side and having a second dielectric layer that varies in thickness, with a third electrode layer being disposed on said second dielectric layer.

17. A method of controlling an elevation aperture of a transducing device comprising:

providing a relaxor ferroelectric transducer having a dielectric layer that varies in thickness, said dielectric layer being on a first side of a transducer, said transducer having an electrode on said dielectric layer;

applying a bias voltage across said transducer to align dipoles of said transducer, including providing an electrical connection to said electrode, thereby providing local variations in degrees of alignment of dipoles in correspondence with said variations in thickness of said dielectric layer;

transmitting acoustic waves from said transducer into a medium of interest while applying said bias voltage, including applying an excitation signal across said transducer, said transmitting having a first penetration depth into said medium of interest; and selectively changing said bias voltage to vary said localized degrees of alignment of dipoles of said transducer, thereby changing an elevation aperture of said transducer such that the penetration depth into said medium of interest and beam characteristics of said acoustic wave transmission vary with respect to said first penetration depth.

18. The method of claim 17 wherein applying said bias voltage is a step of connecting a DC voltage across said transducer.

19. The method of claim 17 wherein providing said transducer includes forming said electrode on a side of said transducer opposite to a second electrode and includes forming said dielectric layer to be concave.

20. The method of claim 17 wherein providing said transducer further includes forming a third electrode on a side of said dielectric layer opposite to said electrode, applying said excitation signal including connecting a source of said excitation signal to said third electrode.

* * * * *